United States Patent
Samukawa

(10) Patent No.: US 7,184,134 B2
(45) Date of Patent: Feb. 27, 2007

(54) REAL-TIME MONITORING APPARATUS FOR PLASMA PROCESS

(75) Inventor: Seiji Samukawa, Sendai (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 232 days.

(21) Appl. No.: 11/060,501

(22) Filed: Feb. 18, 2005

(65) Prior Publication Data

US 2005/0185171 A1    Aug. 25, 2005

(30) Foreign Application Priority Data

Feb. 23, 2004    (JP)    ............... 2004-046385

(51) Int. Cl.
*H01L 21/70* (2006.01)

(52) U.S. Cl. ............... 356/72; 356/630; 156/345.24; 204/298.32

(58) Field of Classification Search ............... 356/72, 356/630; 156/345.13, 345.15, 345.24, 345.25, 156/345.28; 204/298.32
See application file for complete search history.

(56) References Cited

U.S. PATENT DOCUMENTS

| | | | |
|---|---|---|---|
| 5,444,637 A * | 8/1995 | Smesny et al. ............ 702/127 |
| 5,451,784 A | 9/1995 | Loewenhardt et al. |
| 6,691,068 B1 * | 2/2004 | Freed et al. ............... 702/187 |
| 6,759,253 B2 | 7/2004 | Usui et al. |
| 6,820,028 B2 * | 11/2004 | Ye et al. ............... 156/345.13 |
| 6,830,650 B2 * | 12/2004 | Roche et al. .......... 156/345.24 |
| 6,967,109 B2 | 11/2005 | Usui et al. |
| 2005/0115673 A1 * | 6/2005 | Samukawa et al. .... 156/345.28 |

FOREIGN PATENT DOCUMENTS

| | | |
|---|---|---|
| JP | 5-152253 | 6/1993 |
| JP | 8-213374 | 8/1996 |
| JP | 9-266199 | 10/1997 |
| JP | 2002-100617 | 4/2002 |
| JP | 2003-282546 | 10/2003 |

* cited by examiner

*Primary Examiner*—Richard A. Rosenberger
(74) *Attorney, Agent, or Firm*—Staas & Halsey LLP

(57) ABSTRACT

A real-time monitoring apparatus for a plasma process comprises a plurality of measuring units (10) mounted on a semiconductor wafer, a receiving device (7) for receiving a signal transmitted from each of the measuring units (10), and a data processing apparatus (6) for detecting a condition of the semiconductor wafer (3) based on the received signal. In this apparatus, each of the measuring units (10) includes at least one plasma process detection sensor (11), a light-emitting device (16) for converting an output of the plasma process detection sensor into an optical output, and a power supply (17) for supplying drive power to the light-emitting device (16).

18 Claims, 4 Drawing Sheets

REAL-TIME MONITORING APPARATUS FOR PLASMA PROCESS

CROSS-REFERENCE TO RELATED APPLICATION

This application claims priority of Japanese Patent Application No. 2004-046385, filed on Feb. 23, 2004.

FIELD OF THE INVENTION

The present invention relates to a real-time monitoring apparatus, for a plasma process, capable of monitoring the actual processing state of a semiconductor wafer in real time when processing the semiconductor wafer in a plasma processing apparatus.

BACKGROUND OF THE INVENTION

For the fabrication of semiconductor devices and various other high-tech devices, such as micro/nano machines, nanometer-order etching and thin-film deposition must be achieved with high accuracy. Therefore, in a plasma process for such processing, it is essential to monitor the process on an actual wafer. To accomplish this purpose, there is already proposed an on-wafer monitoring system comprising a plasma monitoring sensor, a data transmit/receive processing circuit with optical interconnection, and a power supply which are fabricated in integral fashion on a silicon substrate (Refer to Japanese Unexamined Patent Publication 2003-282546).

Plasma process monitoring is performed by placing this system in a processing position within a plasma apparatus and by generating a plasma in this condition. That is, the on-wafer monitoring system is placed within the plasma apparatus in place of a semiconductor wafer to be processed actually, and the plasma process is monitored by simulating the process.

However, the on-wafer monitoring system described in JPA 2003-282546 is one that checks the surface condition of a wafer at the end of the process (for example, etching) or at an intermediate point during the process, and not one that keeps track of the wafer condition that varies as the process progresses. Furthermore, the monitoring is no more than the simulation of the plasma process, and the system does not provide the real-time monitoring of a semiconductor wafer actually being processed.

With increasing miniaturization of semiconductor devices, it has become increasingly important to control plasma processes in real time and with high accuracy. Further, detecting the endpoint of a process such as etching in real time is extremely important in order to achieve fine feature processing with high accuracy and high yield. However, with the above-described system, neither the real-time monitoring of the plasma process nor the real-time detection of the process endpoint can be accomplished.

SUMMARY OF THE INVENTION

In view of the above situation, it is an object of the present invention to provide a real-time monitoring apparatus for a plasma process, capable of observing the actual processing state of a semiconductor wafer in real time and also capable of detecting the endpoint of the process in real time.

To achieve the above object, a real-time monitoring apparatus for a plasma process according to the present invention comprises: a plurality of measuring units mounted on a semiconductor wafer; a receiving device for receiving a signal transmitted from each of the measuring units; and a data processing apparatus for detecting a condition of the semiconductor wafer based on the received signal, wherein each of the measuring units includes at least one plasma process detection sensor, a light-emitting device for converting an output of the plasma process detection sensor into an optical output, and a power supply for supplying drive power to the light-emitting device.

Further, the plasma process detection sensor is formed as an integrated chip on a semiconductor substrate, and the light-emitting device and the power supply are attached externally to the integrated chip.

Each of the measuring units includes, as the plasma process detection sensor, an endpoint monitor for detecting an endpoint of plasma etching. Further, each of the measuring units includes, as the plasma process detection sensor, a plasma-induced current measuring sensor for detecting an occurrence of a spark in the plasma processing apparatus by means of photoelectric conversion. Furthermore, each of the measuring units includes an ion energy analyzer, a microspectral analyzer, or the like as the plasma process detection sensor.

The endpoint monitor comprises a real pattern portion identical in structure to a plasma processing portion of the semiconductor wafer, and a low-resistance layer embedded in a lower part of the real pattern portion. The plasma-induced current measuring sensor comprises a silicon dioxide layer and an electrode layer embedded in the silicon dioxide layer and supplied with a bias voltage.

As described above, in the plasma process real-time monitoring apparatus of the present invention, each measuring unit is constructed by combining, into a single unit, the plasma process detection sensor, the light-emitting device for converting the output of the sensor into an optical output, and the power supply for supplying drive power to the light-emitting device, and the plasma process is performed with the plurality of measuring units mounted on the semiconductor wafer. Accordingly, any change occurring in the wafer during the plasma process can be monitored in real time from outside the apparatus by detecting a change in the light being output from each measuring unit.

With increasing miniaturization of semiconductor devices, the importance of accurately controlling etching depth, for example, contact hole depth, has been increasing but, with the prior art plasma process, it has been almost impossible to observe the endpoint of contact hole etching in real time when the hole diameter is small. On the other hand, according to the apparatus of the present invention, the endpoint of etching can be accurately detected by using as the plasma process detection sensor the endpoint monitor that monitors the endpoint of wafer etching. Accordingly, semiconductor devices having fine featured contact holes can be fabricated with a high yield.

Further, by using the plasma-induced current measuring sensor which detects a spark generated by charges accumulated on the sidewalls of the plasma apparatus, any macroscopic change occurring in the plasma can be detected at that time. As a result, quick and appropriate action can be taken in process control.

DESCRIPTION OF THE PREFERRED EMBODIMENTS

Figure 1:
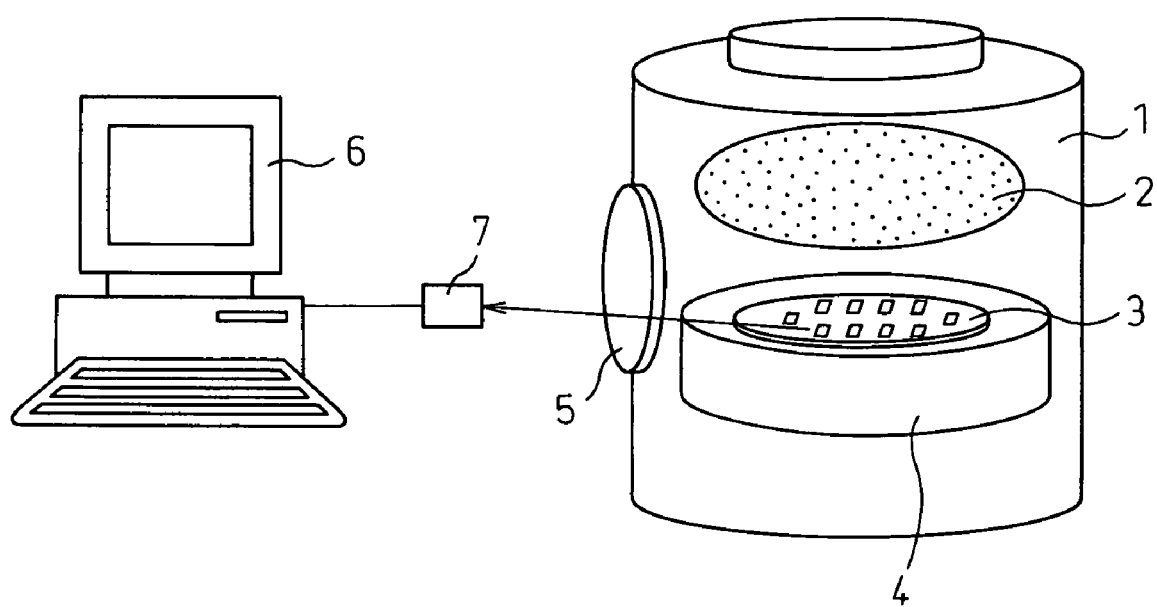
FIG. 1 is a diagram showing in simplified form the configuration of a real-time monitoring apparatus for a plasma process according to the present invention.

FIG. 1 shows in simplified form the configuration of a real-time monitoring apparatus for a plasma process according to one embodiment of the present invention. In the figure, reference numeral 1 is a plasma chamber in which a plasma 2 is generated by introducing, for example, a chlorine gas or the like into an evacuated space (1 Torr to $10^{-4}$ Torr) and by applying a high-frequency electric field (40 kHz to 2.45 MHz) to the gas. Reference numeral 3 is a semiconductor wafer, for example, with a diameter of 300 mm, placed on a holder 4, and a processing pattern is formed thereon by using a mask such as a resist. Reference numeral 5 is a window opened in a chamber sidewall, and 6 is a data processing apparatus which is equipped with a photodetector 7 for receiving an optical output from the surface of the wafer 3.

Figure 2:
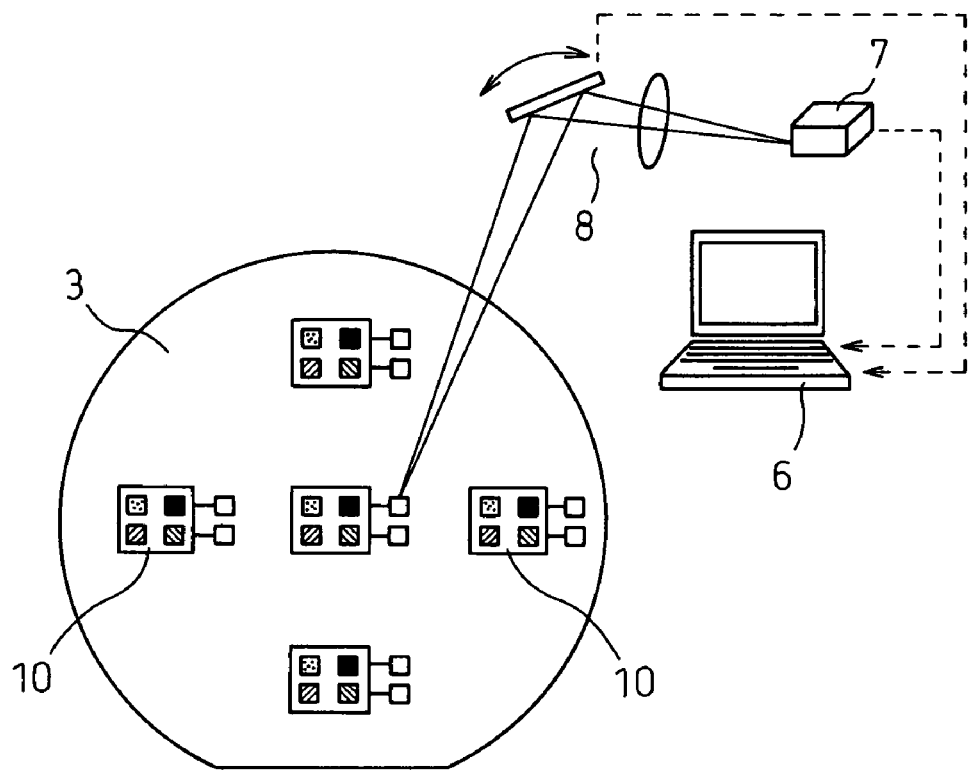
FIG. 2 is a diagram showing in enlarged form a portion of the apparatus shown in FIG. 1.

FIG. 2 is a diagram schematically showing the structure of the wafer 3 along with an optical communication means between the wafer 3 and the data processing apparatus 6. In FIG. 2, reference numeral 8 is an optical system comprising a mirror and a lens and configured to be able to rotate the mirror to scan substantially the entire surface of the wafer 3 for optical detection.

A plurality of process measuring units 10 are mounted on the surface of the wafer 3. The process measuring units 10 are arranged, and uniformly distributed, over the surface of the wafer so that the two-dimensional distribution of the plasma on the wafer 3 can be detected as accurately as possible.

Figure 3:
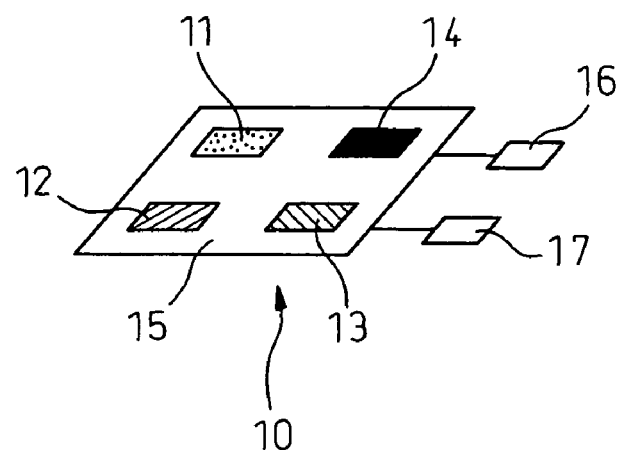
FIG. 3 is a diagram showing the structure of a measuring unit.

FIG. 3 shows the structure of the measuring unit 10. The measuring unit 10 comprises a sensor chip 15 constructed by integrating a plurality of sensors 11 to 14 (or one sensor) on a semiconductor substrate, and a light-emitting device 16, and a sensor driving power supply 17, both externally attached to the sensor chip 15 by such means as wire bonding. The light-emitting device 16 converts a voltage or current output obtained from a sensor into an optical output, and is constructed from a laser diode or a light-emitting diode.

The laser diode or the light-emitting diode may be constructed using four different elements which emit light of different colors corresponding to the respective sensors 11 to 14. Then, each individual sensor can be identified based on the color detected by the photodetector 7.

The sensor chip 15 is obtained by forming a plurality of chips integrally on a semiconductor wafer and dicing the wafer into the individual chips.

The sensor chip 15 includes at least one endpoint monitor 11 as a plasma process measuring sensor. Preferably, the sensor chip 15 further includes a plasma-induced current measuring sensor 12. Other examples of the sensors include the various kinds of sensors described, for example, in JPA 2003-282546, such as an ion energy analyzer, a photon detector, a micro-spectral analyzer, etc.

Here, the number of sensors on the sensor chip 15 is not limited to four as shown in FIG. 3, the only requirement being that at least one sensor, in this case, the endpoint monitor 11, be provided; alternatively, a plurality of sensors of the same kind may be provided.

As described above, according to the real-time monitoring apparatus of the present embodiment, the plurality of measuring units 10, each constructed by externally attaching the light-emitting device 16 and the power supply device 17 to the sensor chip 15, are mounted on the surface of the semiconductor wafer 3 to be actually processed, and the plasma process is performed by placing the wafer 3 inside the plasma chamber 1 so that the plasma process can be observed in real time. At this time, the state of the process is detected by the data processing apparatus 6 analyzing the information transmitted as an optical output from each measuring unit 10.

Figure 4A:
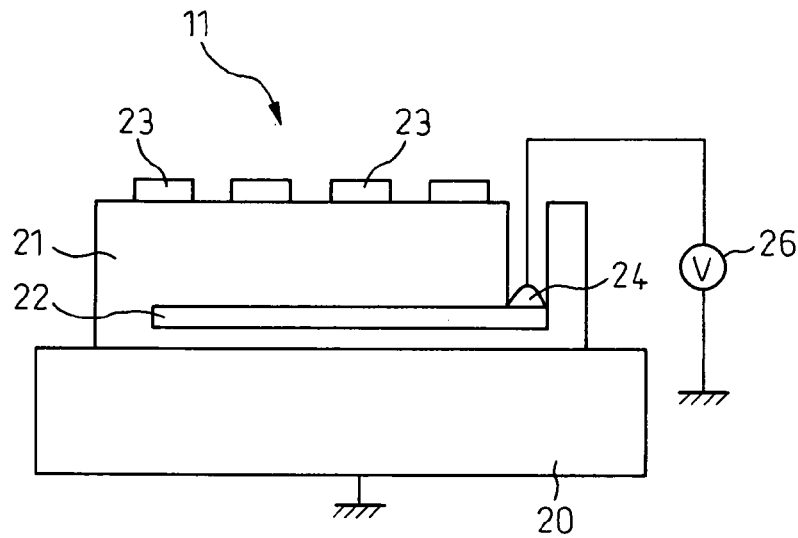
FIG. 4A is a diagram showing the structure of an endpoint monitor.
Figure 4B:
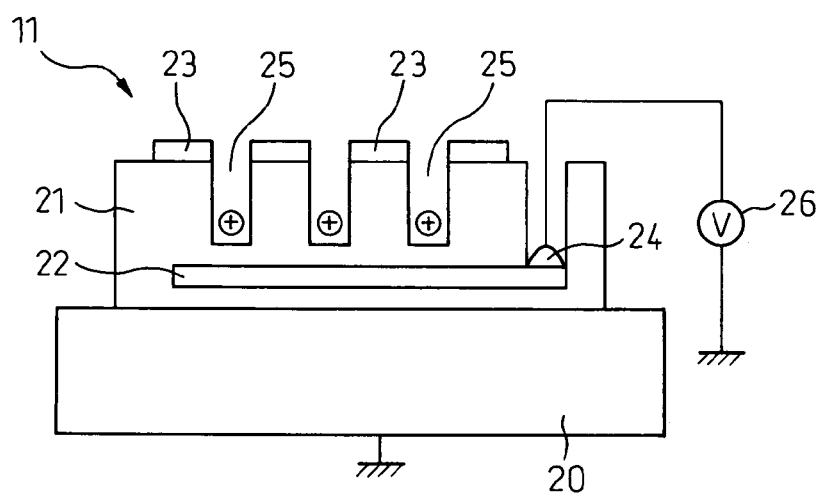
FIG. 4B is a diagram showing the endpoint monitor in an operating condition.
Figure 4C:
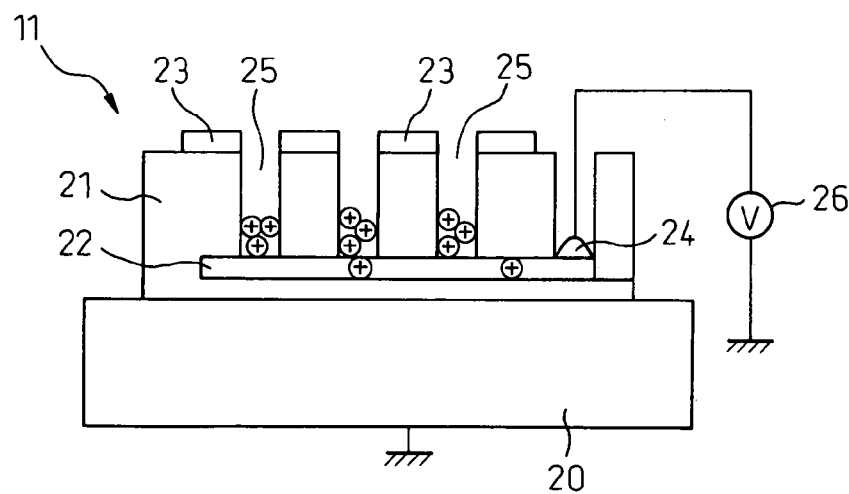
FIG. 4C is a diagram showing the endpoint monitor in another operating condition.

FIGS. 4A to 4C are diagrams showing the structure and operation of the endpoint monitor 11. As shown in FIG. 4A, the endpoint monitor 11 of the present embodiment has a structure in which an embedded electrode 22 is formed in the lower part of a silicon dioxide film 21 formed, for example, by thermally oxidizing a silicon substrate 20. The same mask pattern 23 as the mask pattern on the semiconductor wafer 3 is formed on the upper surface of the silicon dioxide film 21. Accordingly, the silicon substrate 20, the silicon dioxide film 21, and the mask pattern 23 form a real pattern on the semiconductor wafer 3.

Reference numeral 24 is an electrode pad formed on an exposed portion of the embedded electrode 22 that is exposed through an opening formed by selectively etching the silicon dioxide film 21, and a wire is bonded to the pad to detect the potential at one end of the embedded electrode 22. The electrode 22 is formed from phosphorus-doped polysilicon, and its sheet resistance is, for example, 40 $\Omega/\square$. Accordingly, the electrode 22 functions as a low-resistance layer.

The endpoint monitor 11 shown in FIG. 4A is formed in integrated fashion on the chip sensor 15 together with the other sensors, and the chip sensor 15 with the mask pattern 23 formed by a resist on the endpoint monitor 11 is mounted on the semiconductor wafer 3, which is then placed inside the plasma chamber 1. The mask pattern is a pattern for forming contact holes 25 (see FIGS. 4B and 4C) on the semiconductor wafer 3, each hole having, for example, a diameter of 0.5 μm and an aspect ratio of 2.5.

When the semiconductor wafer 3 to which the measuring unit 10 having the endpoint monitor 11 of FIG. 4A has been mounted is placed inside the plasma chamber and exposed to the plasma, the surface areas of the silicon dioxide film 21 that are exposed through the mask pattern are etched by the plasma, resulting in the formation of the holes. At this time, positive ions generated by the plasma are accumulated on the bottom of each hole 25, forming a charge-up voltage (see FIG. 4B).

Figure 5:
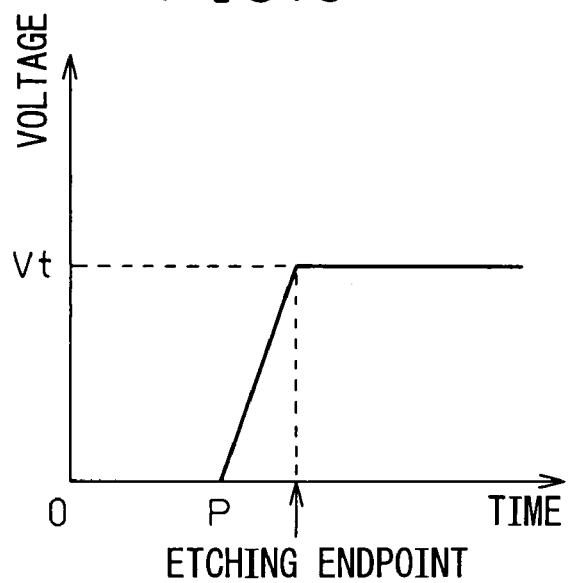
FIG. 5 is a diagram showing the output voltage of the endpoint monitor as a function of time.

FIG. 5 shows the result obtained by measuring the voltage at the bonding portion 24 of the embedded electrode 22 by a voltmeter 26 shown in FIGS. 4A to 4C. At an early stage of etching, as the silicon dioxide film 21 is an insulator, no current flows to the electrode 22 even if positive ions are accumulated in each hole 25. As the etching progresses, and the distance between the electrode 22 and the bottom of the etched hole 25 is closed, a current begins to flow therebetween and the voltmeter 26 begins to detect the voltage (see point P in FIG. 5).

As the etching further progresses and the bottom of the hole 25 contacts the electrode 22, an ammeter 26 begins to show a constant voltage Vt which is determined by the supply of positive ions due to the plasma. Therefore, the point at which the voltage on the voltmeter 26 reaches the constant voltage Vt is the endpoint of the etching which is shown in FIG. 4C.

In the present embodiment, the light-emitting diode is connected in place of the voltmeter 26, and the endpoint of the etching is detected by observing the intensity of the light emission by using the photodetector 7 and the data processing apparatus 6 provided externally to the plasma chamber 1. Further, by obtaining the corresponding voltage value Vt at the time the light intensity of the light-emitting diode becomes constant, it is possible to know the charge-up voltage (=Vt) generated at the bottom of the contact hole 25 at the endpoint of the etching.

If a voltage higher than the breakdown voltage of the semiconductor wafer 3 is applied to it during the fabrication process, dielectric breakdown occurs, causing breakdown of its internal IC circuits. Therefore, when forming the contact holes, the charge-up voltage generated at the hole bottom must be controlled so as not to exceed this breakdown voltage. In the present invention, as the endpoint monitor can easily detect the charge-up voltage Vt at the endpoint of the etching by monitoring the light intensity of the light-emitting device, the result of the detection can be fed back to the plasma process control. That is, if the charge-up voltage is higher than the breakdown voltage, the plasma process is reexamined and the plasma generation conditions are changed so that the voltage value does not exceed the breakdown voltage. Alternatively, the design of the semiconductor wafer 3 can be reexamined, and its breakdown voltage can be increased.

With increasing miniaturization of semiconductor devices, contact holes have decreased in size, and nowadays contact holes about 0.1 μm in size are common. It is almost impossible to observe such fine holes from the outside by illuminating light or by analyzing the plasma light spectrum and determine whether the etching has been done properly. In contrast, according to the present invention, as the endpoint of the etching can be accurately detected by observing the voltage value detected by the endpoint monitor, the endpoint monitor of the invention is extremely useful in high-accuracy processing of semiconductor wafers.

Figure 6:
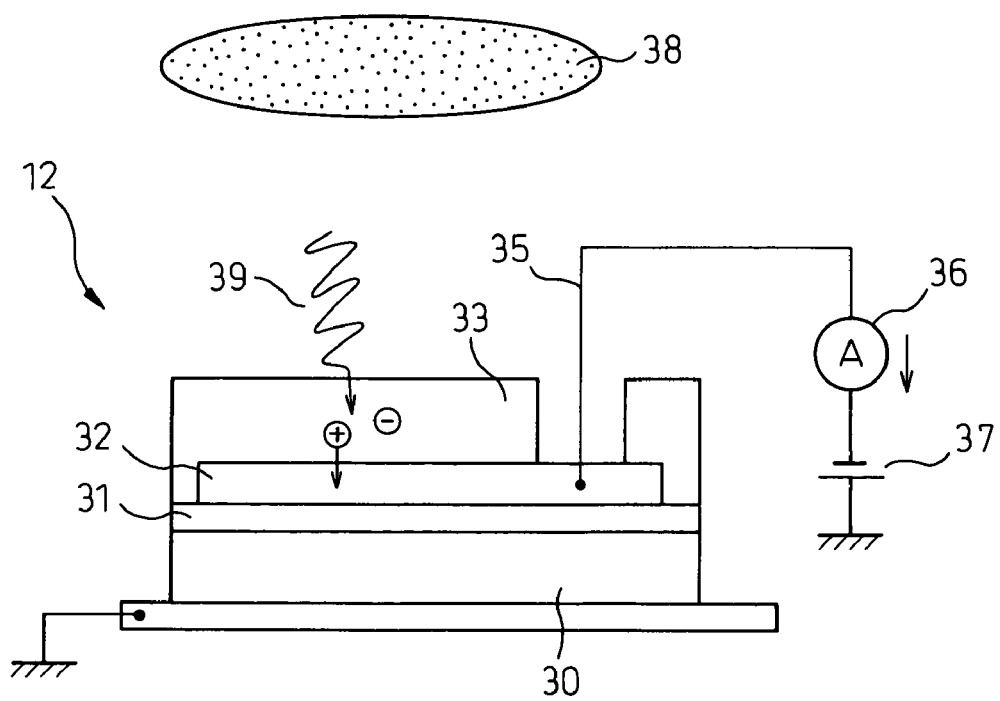
FIG. 6 is a diagram showing the structure of a plasma-induced current measuring sensor.

FIG. 6 is a diagram showing the structure of the plasma-induced current measuring sensor 12. To fabricate the sensor 12, a silicon dioxide film 31 is formed on a silicon substrate 30 to provide insulation over the entire surface thereof, after which an aluminum electrode 32 is formed, and another silicon dioxide film 33 is formed in such a manner as to embed the aluminum electrode 32 therein. Then, an opening is formed through the silicon dioxide film 33, and a wire 34 is bonded to the aluminum electrode 32 which is then connected to the ground via an ammeter 36 and a power supply 37.

As the inner surface of the plasma chamber 1 is covered with an insulating film, charges generated by the plasma 38 are accumulated thereon, and when the amount of accumulation becomes large, a spark is generated, causing the state of the plasma 38 to substantially change. If the state of the plasma changes, the wafer processing process is greatly affected. Accordingly, detecting the occurrence of a spark, i.e., the occurrence of a macroscopic abnormality in the plasma, in real time is extremely important in controlling the fabrication process of a semiconductor device.

When a spark occurs within the plasma chamber, ultraviolet light 39 is generated and enters the silicon dioxide film 33 which is an insulating film. As a result, electron-hole pairs are formed in the silicon dioxide film 33. The holes whose mobility is lower than the electrons are trapped by defects formed in the silicon dioxide film 33, and thus form fixed charges; accordingly, when a bias voltage is applied to the electrode 32, these charges can be monitored as an electric current. Therefore, by externally monitoring the electric current value on the ammeter 36, any macroscopic change in the plasma that occurs inside the plasma chamber can be instantly detected. The electric current value can be monitored by connecting a light-emitting diode in place of the ammeter 36, as in the case of the endpoint monitor.

The change caused in the plasma by a spark can also be observed using the endpoint monitor or the like, but since its influence manifests itself very slowly compared with the generation of an electric current by light, the endpoint monitor is not suitable for instantly detecting the occurrence of the abnormal state.

What is claimed is:

1. A real-time monitoring apparatus for a plasma process which monitors, in real time, the process of processing a semiconductor wafer in a plasma processing apparatus, comprising:
    a plurality of measuring units mounted on said semiconductor wafer;
    a receiving device for receiving a signal transmitted from each of said measuring units; and
    a data processing apparatus for detecting a condition of said semiconductor wafer based on said received signal, wherein
    each of said measuring units includes at least one plasma process detection sensor, a light-emitting device for converting an output of said plasma process detection sensor into an optical output, and a power supply for supplying drive power to said light-emitting device.

2. A real-time monitoring apparatus for a plasma process as claimed in claim 1, wherein said plasma process detection sensor is formed as an integrated chip, and said light-emitting device and said power supply are attached externally to said integrated chip.

3. A real-time monitoring apparatus for a plasma process as claimed in claim 2, wherein each of said measuring units includes, as said plasma process detection sensor, an endpoint monitor for detecting an endpoint of plasma etching.

4. A real-time monitoring apparatus for a plasma process as claimed in claim 2, wherein each of said measuring units includes, as said plasma process detection sensor, a plasma-induced current measuring sensor for detecting an occurrence of a spark in said plasma processing apparatus by means of photoelectric conversion.

5. A real-time monitoring apparatus for a plasma process as claimed in claim 2, wherein each of said measuring units includes an ion energy analyzer as said plasma process detection sensor.

6. A real-time monitoring apparatus for a plasma process as claimed in claim 2, wherein each of said measuring units includes a micro-spectral analyzer as said plasma process detection sensor.

7. A real-time monitoring apparatus for a plasma process as claimed in claim 2, wherein each of said measuring units includes, as said plasma process detection sensor, an endpoint monitor for detecting an endpoint of plasma etching and a plasma-induced current measuring sensor for detecting an occurrence of a spark in said plasma processing apparatus by means of photoelectric conversion.

8. A real-time monitoring apparatus for a plasma process as claimed in claim 7, wherein each of said measuring units further includes an ion energy analyzer.

9. A real-time monitoring apparatus for a plasma process as claimed in claim 8, wherein each of said measuring units further includes a micro-spectral analyzer.

10. A real-time monitoring apparatus for a plasma process as claimed in claim 1, wherein each of said measuring units includes, as said plasma process detection sensor, an endpoint monitor for detecting an endpoint of plasma etching.

11. A real-time monitoring apparatus for a plasma process as claimed in claim 10, wherein said endpoint monitor comprises a real pattern portion identical in structure to a plasma processing portion of said semiconductor wafer, and a low-resistance layer embedded in a lower part of said real pattern portion.

12. A real-time monitoring apparatus for a plasma process as claimed in claim 1, wherein each of said measuring units includes, as said plasma process detection sensor, a plasma-induced current measuring sensor for detecting an occurrence of a spark in said plasma processing apparatus by means of photoelectric conversion.

13. A real-time monitoring apparatus for a plasma process as claimed in claim 12, wherein said plasma-induced current measuring sensor comprises a silicon dioxide layer and an electrode layer embedded in said silicon dioxide layer and supplied with a bias voltage.

14. A real-time monitoring apparatus for a plasma process as claimed in claim 1, wherein each of said measuring units includes an ion energy analyzer as said plasma process detection sensor.

15. A real-time monitoring apparatus for a plasma process as claimed in claim 1, wherein each of said measuring units includes a micro-spectral analyzer as said plasma process detection sensor.

16. A real-time monitoring apparatus for a plasma process as claimed in claim 1, wherein each of said measuring units includes, as said plasma process detection sensor, an endpoint monitor for detecting an endpoint of plasma etching and a plasma-induced current measuring sensor for detecting an occurrence of a spark in said plasma processing apparatus by means of photoelectric conversion.

17. A real-time monitoring apparatus for a plasma process as claimed in claim 16, wherein each of said measuring units further includes an ion energy analyzer.

18. A real-time monitoring apparatus for a plasma process as claimed in claim 17, wherein each of said measuring units further includes a micro-spectral analyzer.

* * * * *

UNITED STATES PATENT AND TRADEMARK OFFICE
CERTIFICATE OF CORRECTION

| | |
|---|---|
| PATENT NO. | : 7,184,134 B2 |
| APPLICATION NO. | : 11/060501 |
| DATED | : February 27, 2007 |
| INVENTOR(S) | : Seiji Samukawa |

It is certified that error appears in the above-identified patent and that said Letters Patent is hereby corrected as shown below:

On the Title Page,

Item [75]: (Inventor), Line 1, change "Sendai" to --Sendai-shi--.

Item [73]: (Assignee), Line 2, change "Yokohama" to --Yokohama-shi--.

Signed and Sealed this

Twenty-sixth Day of June, 2007

JON W. DUDAS
*Director of the United States Patent and Trademark Office*